US009472607B2

(12) United States Patent
Hekmatshoartabari et al.

(10) Patent No.: US 9,472,607 B2
(45) Date of Patent: Oct. 18, 2016

(54) ACTIVE MATRIX USING HYBRID INTEGRATED CIRCUIT AND BIPOLAR TRANSISTOR

(71) Applicant: GLOBALFOUNDRIES INC., Grand Cayman (KY)

(72) Inventors: Bahman Hekmatshoartabari, White Plains, NY (US); Tak H. Ning, Yorktown Heights, NY (US); Ghavam G. Shahidi, Pound Ridge, NY (US); Davood Shahrjerdi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/717,344

(22) Filed: May 20, 2015

(65) Prior Publication Data

US 2015/0270326 A1     Sep. 24, 2015

Related U.S. Application Data

(63) Continuation of application No. 13/949,498, filed on Jul. 24, 2013, now Pat. No. 9,059,123.

(51) Int. Cl.
*H01L 27/32* (2006.01)
*H01L 23/522* (2006.01)
*H01L 27/06* (2006.01)
(Continued)

(52) U.S. Cl.
CPC ......... *H01L 27/3276* (2013.01); *G09G 3/3225* (2013.01); *H01L 23/5226* (2013.01); *H01L 27/0694* (2013.01); *H01L 27/1207* (2013.01); *H01L 27/326* (2013.01); *H01L 27/3265* (2013.01); *H01L 29/04* (2013.01); *H01L 29/1004* (2013.01); *H01L 29/16* (2013.01); *H01L 29/73* (2013.01); *H01L 29/808* (2013.01); *G09G 2300/0842* (2013.01); *H01L 27/3244* (2013.01); *H01L 2251/533* (2013.01); *H01L 2251/5315* (2013.01); *H01L 2924/0002* (2013.01)

(58) Field of Classification Search
None
See application file for complete search history.

(56) References Cited

U.S. PATENT DOCUMENTS 7,535,441 B2    5/2009  Smith et al.
7,741,679 B2    6/2010  Yamaguchi et al.
(Continued)

OTHER PUBLICATIONS

Non-final Office Action for U.S. Appl. No. 13/949,498 mailed on Oct. 20, 2014.
(Continued)

*Primary Examiner* — Michael Lebentritt
*Assistant Examiner* — Jordan Klein
(74) *Attorney, Agent, or Firm* — Michael LeStrange; Hoffman Warnick LLC

(57) ABSTRACT

A hybrid integrated circuit device includes a semiconductor-on-insulator substrate having a base substrate, a semiconductor layer and a dielectric layer disposed therebetween, the base substrate being reduced in thickness. First devices are formed in the semiconductor layer, the first devices being connected to first metallizations on a first side of the dielectric layer. Second devices are formed in the base substrate, the second devices being connected to second metallizations formed on a second side of the dielectric layer opposite the first side. A through via connection is configured to connect the first metallizations to the second metallizations through the dielectric layer. Pixel circuits and methods are also disclosed.

17 Claims, 11 Drawing Sheets

(51) Int. Cl.
*H01L 27/12* (2006.01)
*H01L 29/04* (2006.01)
*H01L 29/10* (2006.01)
*H01L 29/16* (2006.01)
*H01L 29/73* (2006.01)
*H01L 29/808* (2006.01)
*G09G 3/32* (2016.01)

(56) References Cited

U.S. PATENT DOCUMENTS

| | | | |
|---|---|---|---|
| 7,834,824 B2 | 11/2010 | Routley et al. | |
| 7,851,804 B2 | 12/2010 | Takahashi | |
| 7,935,961 B2 | 5/2011 | Lee et al. | |
| 7,948,170 B2 | 5/2011 | Striakhilev et al. | |
| 8,446,394 B2* | 5/2013 | Stewart | G09G 3/3241 |
| | | | 315/169.3 |
| 8,574,929 B1 | 11/2013 | Or-Bach et al. | |
| 8,674,470 B1* | 3/2014 | Or-Bach | H01L 25/0657 |
| | | | 257/499 |
| 2005/0142703 A1 | 6/2005 | Zahurak et al. | |
| 2006/0138403 A1 | 6/2006 | Yu | |
| 2006/0139275 A1* | 6/2006 | Yu | G09G 3/3233 |
| | | | 345/92 |
| 2007/0018933 A1 | 1/2007 | Lee | |
| 2007/0087509 A1 | 4/2007 | Maeda et al. | |
| 2007/0222923 A1 | 9/2007 | Wang et al. | |
| 2007/0247398 A1 | 10/2007 | Nathan et al. | |
| 2007/0267723 A1* | 11/2007 | Bernstein | H01L 23/481 |
| | | | 257/621 |
| 2010/0246152 A1 | 9/2010 | Lin et al. | |
| 2011/0175152 A1 | 7/2011 | Booth et al. | |
| 2011/0279433 A1 | 11/2011 | Ryu | |
| 2013/0015502 A1 | 1/2013 | Fox et al. | |
| 2013/0221433 A1 | 8/2013 | Molin et al. | |
| 2013/0242500 A1 | 9/2013 | Lin et al. | |
| 2014/0361350 A1* | 12/2014 | Chen | H01L 27/0623 |
| | | | 257/273 |
| 2015/0279913 A1* | 10/2015 | Gates | G09G 3/32 |
| | | | 257/40 |

OTHER PUBLICATIONS

Notice of Allowance for U.S. Appl. No. 13/972,272 mailed on Jul. 31, 2014.

* cited by examiner

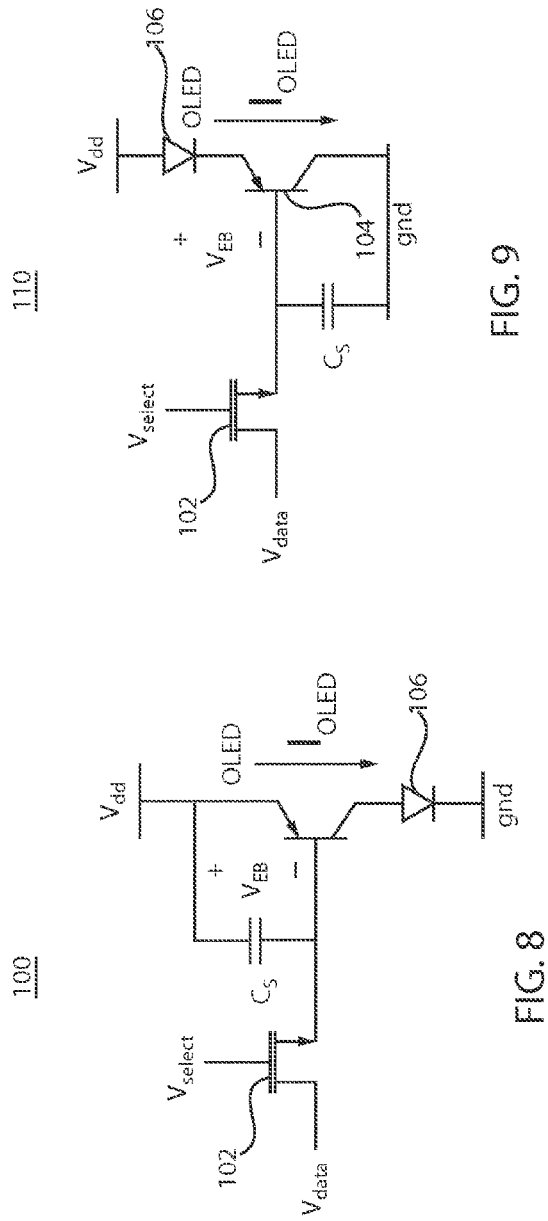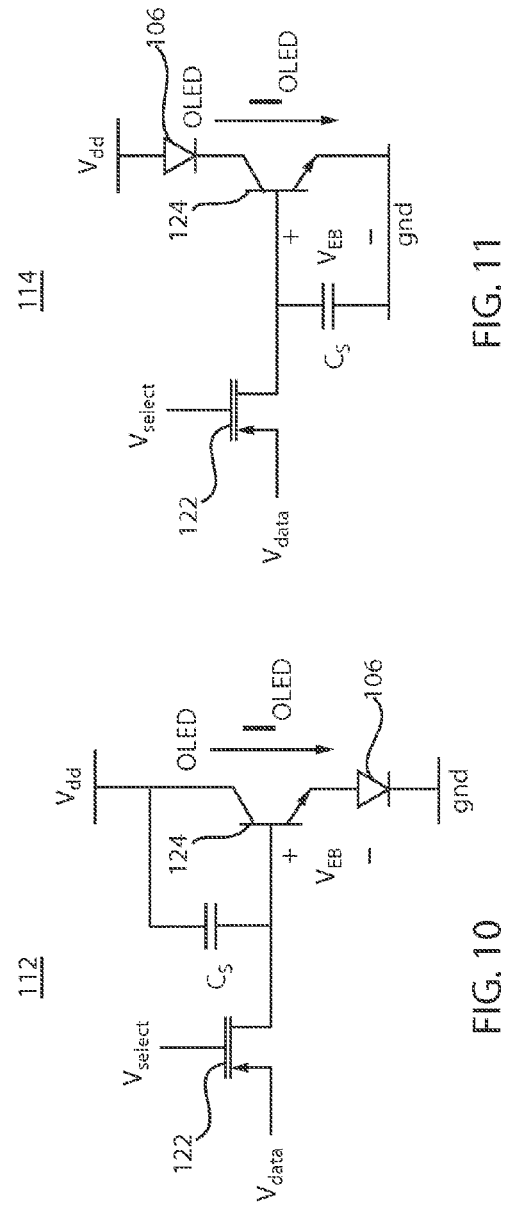

ACTIVE MATRIX USING HYBRID INTEGRATED CIRCUIT AND BIPOLAR TRANSISTOR

CROSS-REFERENCE TO RELATED APPLICATIONS

This application is a Continuation of, and claims priority to copending U.S. patent application Ser. No. 13/949,498, filed on Jul. 24, 2013, incorporated herein by reference in its entirety.

BACKGROUND

1. Technical Field

The present invention relates to integrated circuits, and more particularly to active matrix circuits and fabrication processes having hybrid devices and bipolar transistors integrated therein.

2. Description of the Related Art

In applications such as active-matrix displays, control/driving circuitry is implemented with standard very large scale integration (VLSI) devices and connected to a backplane (an array of thin film transistors (TFTs) used for driving passive elements such as organic light emitting diodes (OLEDs) and liquid crystal displays (LCDs)) externally. The TFTs are typically comprised of a-Si:H or metal-oxide semiconductors because of their low-cost, large-area compatibility and low deposition temperatures, which are compatible with low-cost substrates. However, the poor mobility and stability of these devices is not sufficient for very high-resolution and low-power displays, such as, e.g., pico-projectors and micro-displays. The limited performance of these conventional devices (particularly with respect to mobility and therefore drive current and switching speed) is limited by the non-crystalline nature of the semiconductor materials.

Crystalline semiconductors result in high processing temperatures and are not compatible with low-cost substrates used with amorphous and polycrystalline devices. Non-monolithic integration of the driver/control circuitry also limits the compactness and lightness of the display, which are important considerations for mobile applications.

Applications such as active matrix displays need high performance scanning, control and hold circuits, which typically implemented by complementary metal oxide semiconductor (CMOS) technology and are integrated off-chip. The backplane section (transistors and pixels) are typically comprised of lower-performance devices, e.g., a-Si:H on glass. Higher performance devices are desired for higher resolution/lower power.

SUMMARY

A hybrid integrated circuit device includes a semiconductor-on-insulator substrate having a base substrate, a semiconductor layer and a dielectric layer disposed therebetween, the base substrate being reduced in thickness. First devices are formed in the semiconductor layer, the first devices being connected to first metallizations on a first side of the dielectric layer. Second devices are formed in the base substrate, the second devices being connected to second metallizations formed on a second side of the dielectric layer opposite the first side. A through via connection is configured to connect the first metallizations to the second metallizations through the dielectric layer.

A pixel circuit for an active matrix display includes a junction field effect transistor (JFET) enabled by a select signal, and a bipolar junction coupled to the JFET to receive data through the JFET, when enabled, at a base of the bipolar junction, the JFET and the bipolar junction including a crystalline channel material. An organic light emitting diode (OLED) is connected on one side between one of an emitter and a collector of the bipolar junction and, on the other side, between one of supply voltage and ground.

A method for forming a hybrid integrated circuit device includes doping a base substrate of a semiconductor-on-insulator substrate including the base substrate, a semiconductor layer and a dielectric layer disposed therebetween; forming first devices in the semiconductor layer; forming first metallizations on a first side of the dielectric layer for connecting to the first devices; reducing a thickness of the base substrate; forming second devices in the base substrate; forming second metallizations on a second side of the dielectric layer opposite the first side to connect to the second devices; and connecting the first metallizations to the second metallizations through the dielectric layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 8 is a schematic diagram showing a direct programming pixel circuit having an n-channel junction field effect transistor (JFET) coupled to a p-n-p bipolar junction for activating a bottom-emission organic light emitting diode (OLED) in accordance with the present principles;

FIG. 9 is a schematic diagram showing a non-direct programming pixel circuit having an n-channel JFET coupled to a p-n-p bipolar junction for activating a top-emission OLED in accordance with the present principles;

FIG. 10 is a schematic diagram showing a non-direct programming pixel circuit having a p-channel JFET coupled to a n-p-n bipolar junction for activating a bottom-emission OLED in accordance with the present principles;

FIG. 11 is a schematic diagram showing a direct programming pixel circuit having a p-channel JFET coupled to an n-p-n bipolar junction for activating a top-emission OLED in accordance with the present principles;

DETAILED DESCRIPTION OF PREFERRED EMBODIMENTS

Figure 1:
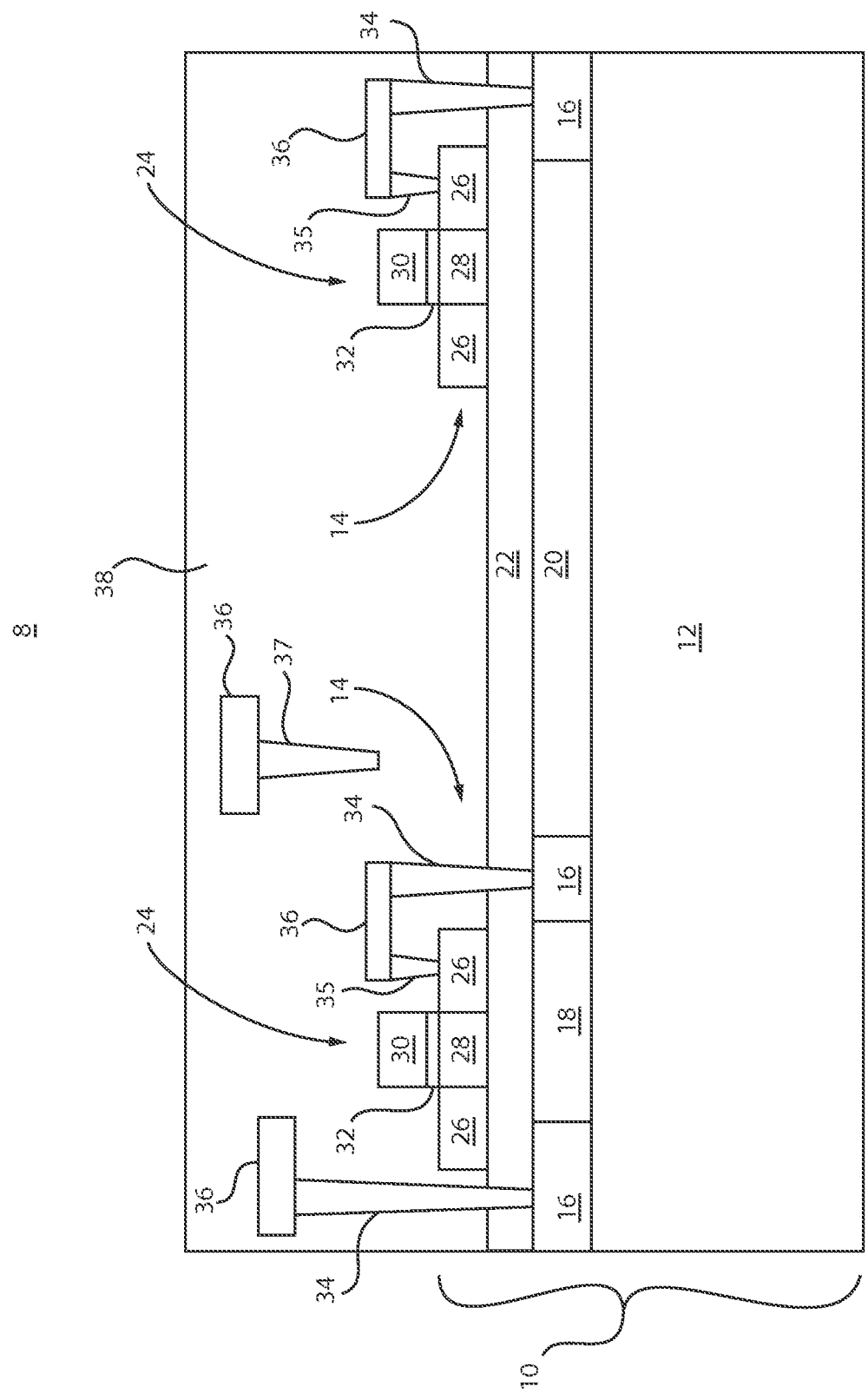
FIG. 1 is a cross-sectional view of a device formed on a semiconductor on insulator substrate with doped regions formed through a buried insulator and devices formed in a semiconductor layer in accordance with the present principles.

In accordance with the present principles, devices and methods for fabricating an active matrix display are disclosed. In one embodiment, control/driver circuitry is implemented on a semiconductor on insulator (SOI) substrate using VLSI technology, while a thin film transistor (TFT) backplane is implemented on a thinned handle substrate. The control/driver circuitry may be connected to the back-plane using through-substrate vias or through-silicon vias (TSVs). The TFTs are formed by heterojunction contacts grown at low-temperatures, which do not affect the driver/control circuitry. The performance of the TFTs substantially exceeds that of non-crystalline materials due to the use of the crystalline handle substrate material as the TFT channel. It should be understood that the present principles are not limited to active matrices and the circuitry on the front and the TFTs on the handle substrate may be used for any known application. For example, the TFTs can be used to implement additional memory.

Pixel circuits are also provided for driving pixels (e.g., organic light emitting diodes (OLEDs)) in an active matrix display backplane with a bipolar transistor driver and a junction field-effect transistor (JFET) switch. Such pixel circuits are particularly useful for thin-film devices comprised of crystalline channel materials and low-temperature contacts. The bipolar transistors and JFETs can be processed simultaneously without increasing the number of lithography mask steps. However, the pixel circuit is applicable to bipolar transistors and JFETs implemented in any technology.

It is to be understood that the present invention will be described in terms of a given illustrative architecture having a particular substrate or wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit (IC), such as a chip or display device) may be created in a graphical computer programming language, and stored in a computer storage medium (such as a disk, tape, physical hard drive, or virtual hard drive such as in a storage access network). If the designer does not fabricate ICs or the photolithographic masks used to fabricate ICs, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting ICs can be distributed by the fabricator in raw wafer form (that is, as a single wafer that has multiple unpackaged chips), as a bare die, or in a packaged form. In the latter case, the IC is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. The present embodiments may be part of a display device or other integrated circuit chip.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated structure 8 includes a semiconductor-on-insulator (SOI) substrate 10. The SOI substrate or wafer includes a handle substrate or base substrate 12, a dielectric layer 22 (e.g., a buried oxide (BOX)) and a semiconductor layer 14. The semiconductor layer 14 and the handle or base substrate 12 may include monocrystalline silicon, although other materials may be employed. The base substrate 12 may be implanted with p or n type dopants through the dielectric layer 22. The p or n type dopants form doped regions 18 and 20. An optional doping may be employed with an n+ or p+ implant performed on the handle substrate 12 through the dielectric layer 22 to form doped regions 16.

Next, conventional complementary metal oxide semiconductor (CMOS) processing may be performed (e.g., front end of the line (FEOL) and/or back end of the line (BEOL) processing) to form CMOS devices 24. The semiconductor layer 14 of the SOI wafer 12 is employed to form doped source and drain (S/D) regions 26 (e.g., n+) and a channel region 28. A gate dielectric 32 and a gate conductor 30 are also formed. Next, a dielectric layer (s) 38, e.g., silicon dioxide or equivalent is/are deposited and patterned to form vias. Conductive material is deposited in the vias to form contacts 34, 35 and 37. Metallizations 36 are also formed to make connections between the contacts and upper metal layers. The contacts 34, 35 and 37 may be formed at different times on different portions of the dielectric layer(s) 38. Contacts 34 are formed through the dielectric layer 22 to make contact with regions 16. Regions 16 and/or contacts 34 may be employed in forming through silicon vias (TSVs). It should be understood that the structures formed in FIG. 1 are illustrative and that any components, metallizations, diffusion regions, etc. may be employed.

Figure 2:
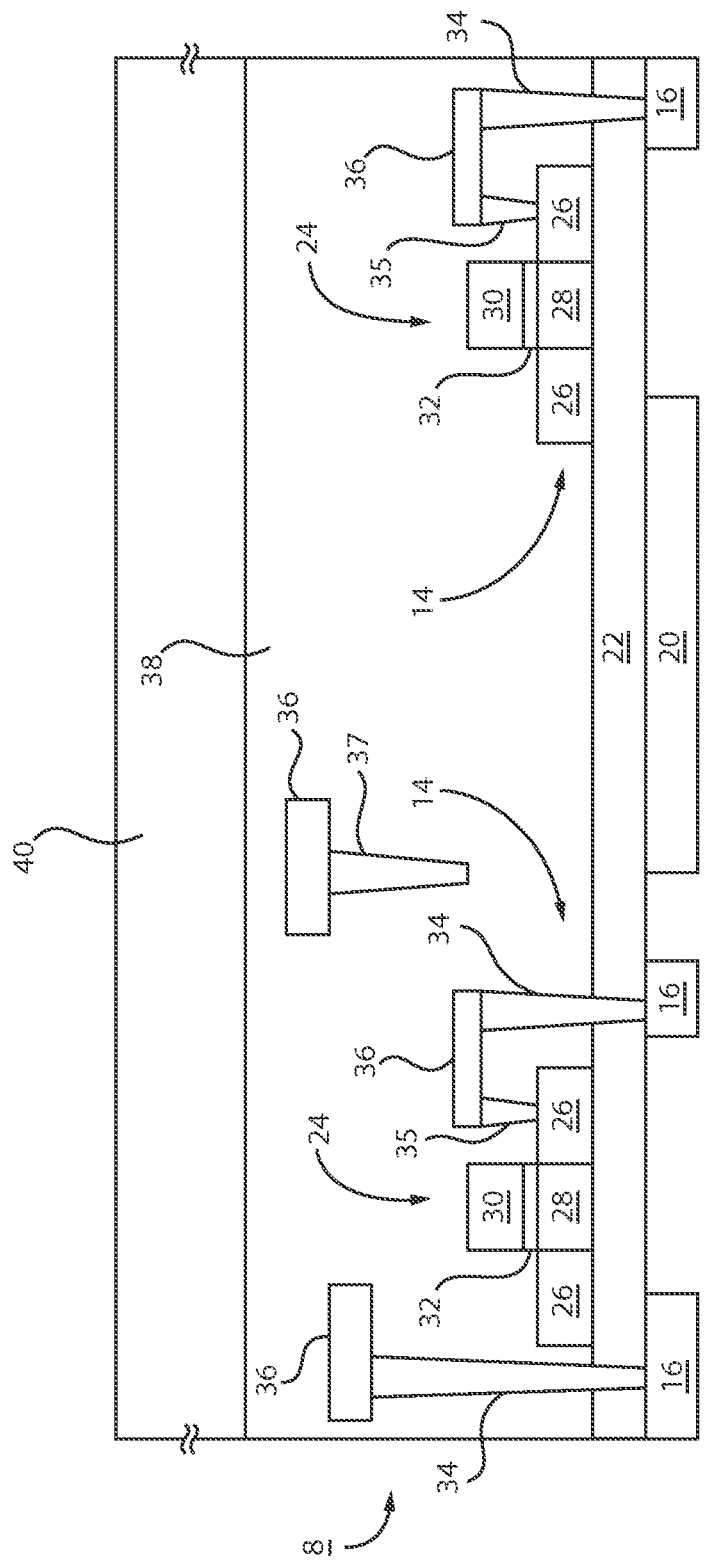
FIG. 2 is a cross-sectional view of the device of FIG. 1 with a handle or base substrate reduced and formed into crystalline doped regions in accordance with the present principles.

Referring to FIG. 2, a support substrate 40 is attached to a front side of the device 8. The support substrate 40 may include a semiconductor material, glass, a polymer, or any other suitable material. The handle substrate 12 is etched back, e.g., by one of more of lapping, chemical mechanical polishing (CMP), etching, spalling, etc. Remaining sections of the handle substrate 12 are patterned to form active areas 20 and contact regions 16.

Figure 3:
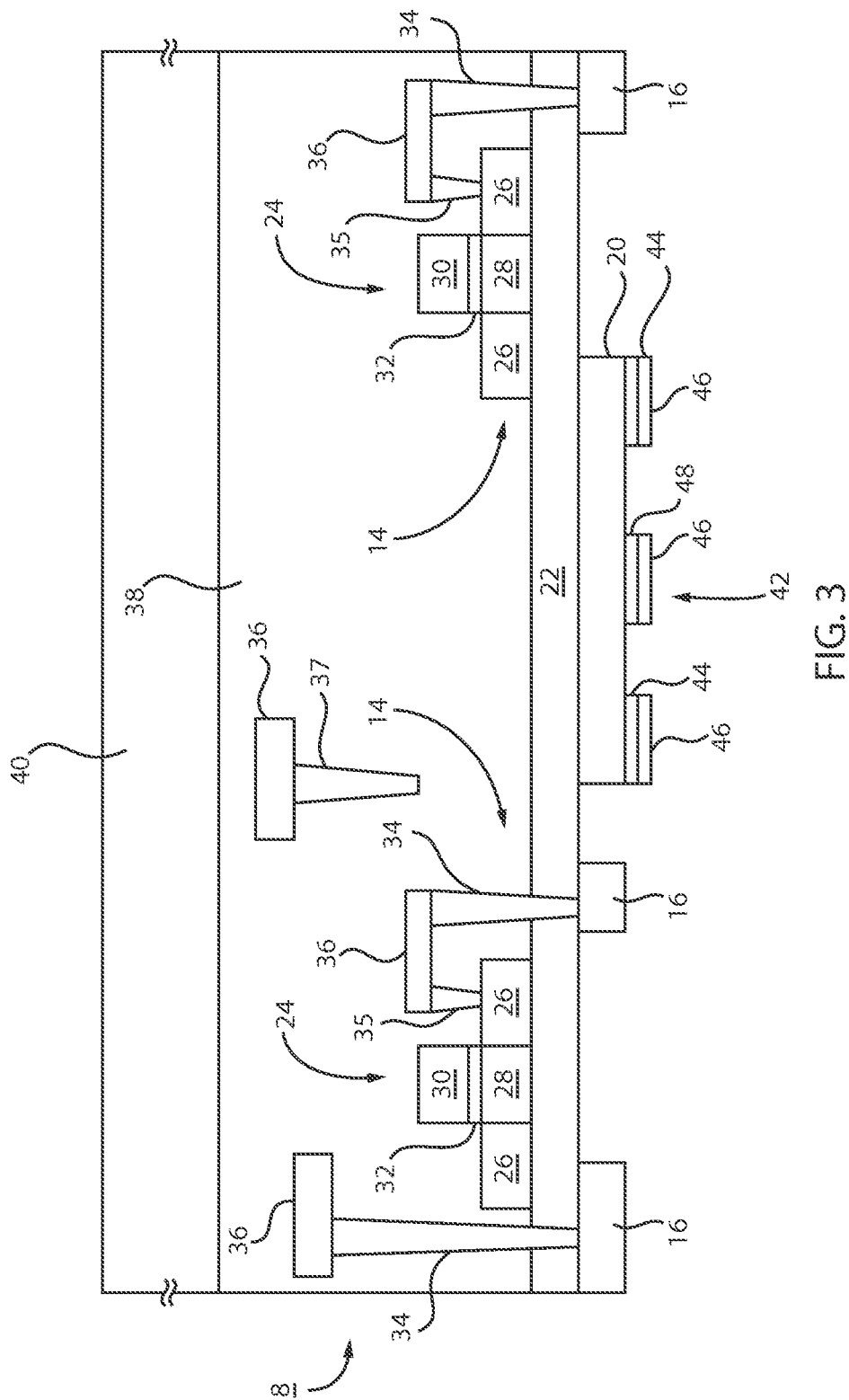
FIG. 3 is a cross-sectional view of the device of FIG. 2 with the doped regions having low temperature deposited doped regions and contact metal formed thereon in accordance with the present principles.
Figure 4:
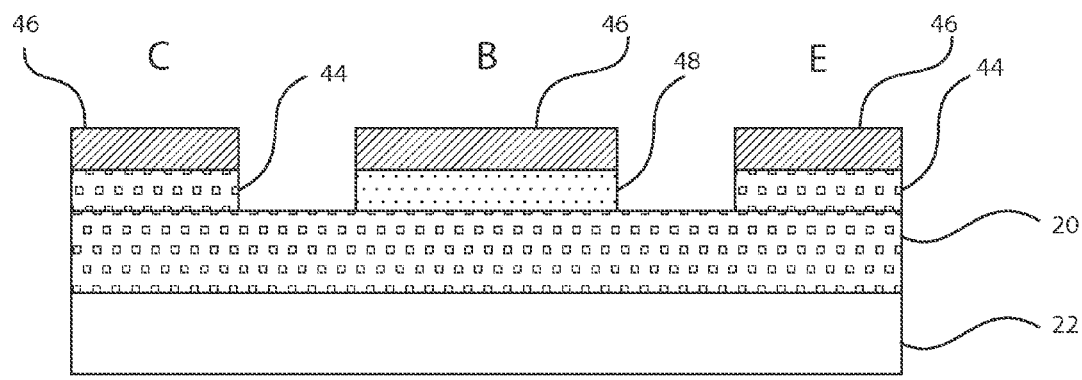
FIG. 4 is a cross-sectional view of an illustrative bipolar device formed with the doped regions in FIG. 3 in accordance with the present principles.
Figure 5:
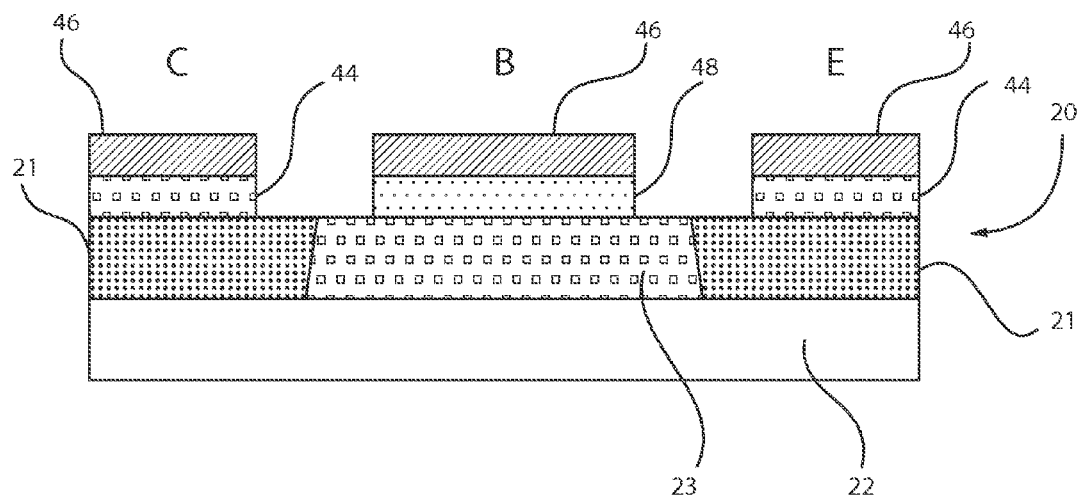
FIG. 5 is a cross-sectional view of another illustrative bipolar device formed with the doped regions in FIG. 3 in accordance with the present principles.
Figure 6:
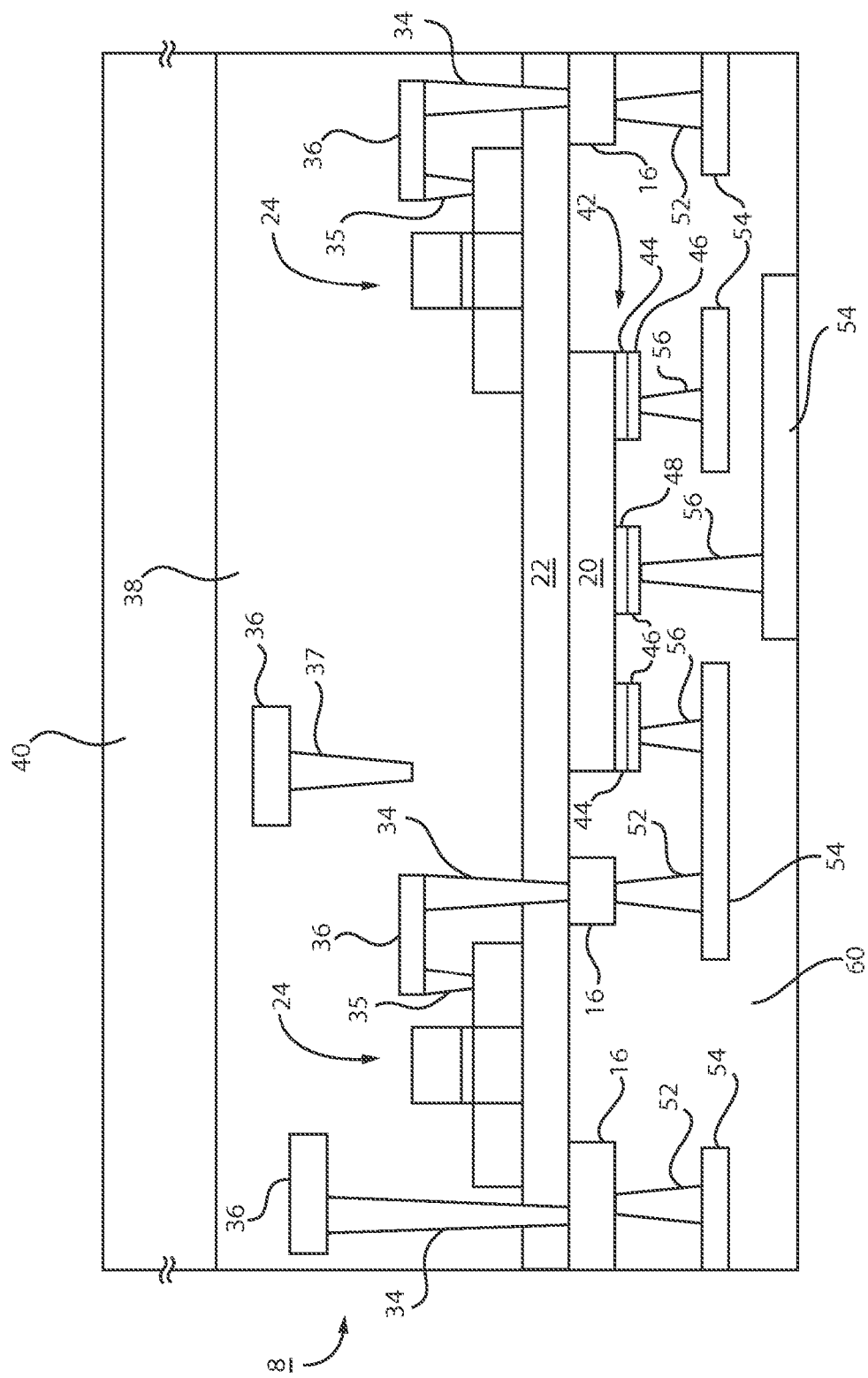
FIG. 6 is a cross-sectional view of the device of FIG. 3 with a support substrate bonded to a first metallization region and the first metallization region being connected to a second metallization through the buried insulator using the highly doped regions in accordance with the present principles.

Referring to FIG. 3, devices 42 may be formed on region 20 or on other areas of a back surface of device 8. In one embodiment, an in-situ doped hydrogenated Si layer may be deposited to form regions 44 and 48, followed by the formation of a metal electrode layer 46, which is patterned to form a collector, base and emitter for a bipolar transistor and/or other devices. The hydrogenated Si layer (Si:H) may be formed by plasma enhanced chemical vapor deposition (PECVD) of the Si:H layers using known methods. FIGS. 4, 5 and 6, show different exemplary device structures, which may be formed for component 42.

Referring to FIG. 4, in one embodiment, the structure 42 includes a p-type doped region 20 having Si:H layers patterned to form regions 44 and 48. The Si:H layers may be amorphous, nano-crystalline, micro-crystalline, poly-crystalline, single-crystalline or combinations thereof. In one embodiment, the Si:H layer is single-crystalline. In another embodiment, the Si:H layer is comprised of a single-crystalline/amorphous bilayer. In some embodiments, the Si:H layers may include other elements such as germanium (Ge), carbon (C), fluorine (F), nitrogen (N), oxygen (O), deuterium (D) or combinations thereof.

An electrode layer 46 is formed on the regions 44 and 48. The electrodes 46 may be patterned together with regions 44 and/or 48 in a single etch process. The regions 44, 48 may be deposited using a low temperature PECVD process. For example, the PECVD may be performed at less than about 450 degrees C. and more preferably between about 150 degrees C. and 250 degrees C. The regions 44 may include n+ type doping, and region 48 may include p+ type doping, when region 20 is p-type doped. In another embodiment, the regions 44 may include p+ type doping and region 48 may include n+ type doping, when region 20 is n-type doped. An intrinsic Si:H layer may be optionally disposed between regions 44 and the substrate 20 and/or between region 48 and the substrate 20 to improve the surface passivation of the substrate 20. The electrode 46 may be any suitable metal material or transparent conductive electrode material (e.g., transparent conductive oxides, such as indium tin oxide, aluminum-doped zinc oxide, etc.). The component 42 includes an emitter E, a base B and a collector C.

Referring to FIG. 5, in another embodiment, the region 20 includes a p-type doped region 23 and n+ type doped regions 21. In one example, the n+ doped regions 21 are formed by implantation through the BOX similar to regions 16 in FIGS. 1, 2, 3 and 6. The same implantation step as that for regions 16 or an additional implantation step may be employed to form the regions 21. As commonly referred to in a lateral bipolar transistor device, the n+ doped regions 21 form "intrinsic" emitter and collector regions, while n+ doped regions 44 form "extrinsic" emitter and collector regions. The intrinsic collector and emitter regions 21 reduce the access resistance of the collector and emitter contacts.

An a-Si:H layer is patterned to form regions 44 and 48. An electrode layer 46 is formed on the regions 44 and 48. The electrodes 46 may be patterned together with regions 44 and/or 48 in a single etch process. The regions 44, 48 may be deposited using a low temperature PECVD process. For example, the PECVD may be performed at less than about 450 degrees C. and more preferably between about 150 degrees C. and 250 degrees C. The dopant conductivities may be switched. For example, the regions 44 may include n+ type doping, and region 48 may include p+ type doping. The electrode 46 may be any suitable metal material or transparent conductive electrode material (e.g., transparent conductive oxides, such as indium tin oxide, aluminum-doped zinc oxide, etc.). The component includes an emitter E, a base B and a collector C. The structures of FIGS. 4 and 5 are illustrative, other bipolar junctions or other transistor devices (JFETs, etc.) may also be employed.

Referring to FIG. 6, passivation and metallization steps are performed to create connections to component(s) 42 and make connections to devices and components on device 8 as well as to form passive elements, such as LEDs and LCDs elements (not illustrated) to follow. Standard processes are employed to forming contacts 52, 56 and metal lines/layers 54 in a passivation layer 60. Contacts 52 connect to regions 16 to create a conductive path to contacts 34. Contacts 56 make connections to component 42, which illustratively includes a bipolar transistor device. Contacts 52, 56, metal lines 54 and passivation layer 60 may be formed in layers/stages. The component 42 may include intrinsic emitter and/or collector regions for lower access resistance (FIG. 5).

Figure 7:
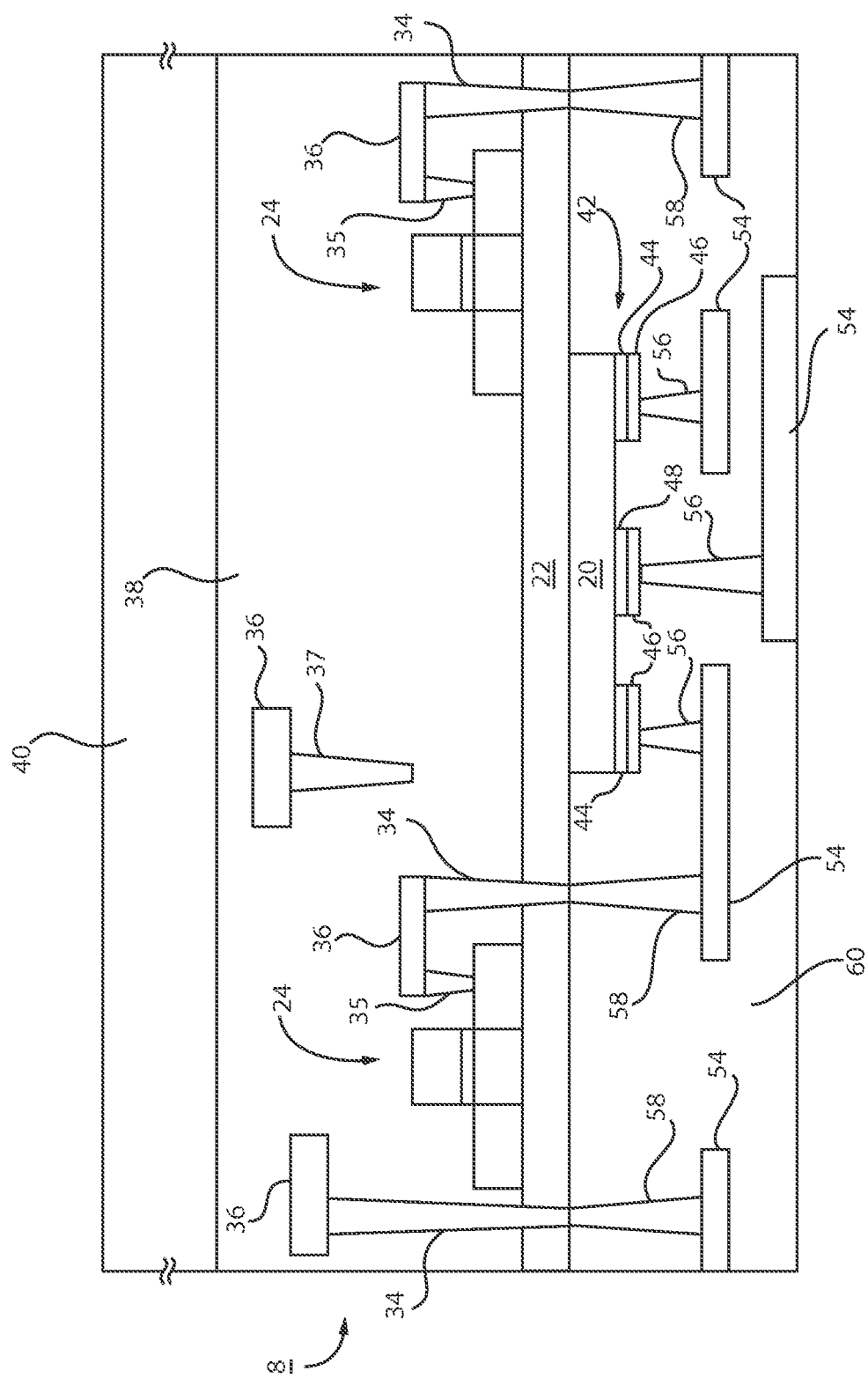
FIG. 7 is a cross-sectional view of the device of FIG. 3 with a support substrate bonded to a first metallization region and the first metallization region being connected to a second metallization through the buried insulator using metal to metal contact to a through via in accordance with the present principles.

Referring to FIG. 7, instead of regions 16, metal-to-metal contact is made through the dielectric layer 22 between contacts 34 and 58. $n^+$ or $p^+$ implantation may not be needed through the dielectric layer 22 (though this implantation may be employed for component 42). Direct metal-to-metal contact may result in lower resistance. The component 42 may include intrinsic emitter and/or collector regions for lower access resistance (FIG. 5).

Component 42, employed with CMOS devices 24, provides a hybrid bipolar and field-effect transistor system, which employs crystalline (single or multi/poly) channel materials. In addition, component 42 includes junctions/contacts which are formed by low-temperature processes compatible with large-area electronics (e.g., regions 44 and 48). In particular, a bipolar device 42 is beneficial for driving an organic light-emitting diode (OLED) in an active matrix display since an OLED is driven in DC and the OLED current and thus brightness is directly proportional to the current provided by the driver transistor. This has been challenging traditionally due to the low TFT field-effect mobility. However, the usage of bipolar transistors needs a new pixel circuit as presented herein.

The hybrid device or system of FIG. 7 may include multiple technologies (e.g., CMOS device 24 on one side and bipolar/JFET device 42 on the other). In other examples, the hybrid device may include a double sided active matrix display. Although a few illustrative devices are shown, an array of lateral bipolar transistors (42) may be integrated on the first side of the buried insulator (dielectric layer 22), such as a buried oxide (BOX). The array is preferably in electrical communication with active or passive devices integrated on the other side of the buried insulator with conductive vias through the buried insulator. The component 42 includes at least one emitter, base or collector contact of the lateral bipolar transistors which is comprised of a silicon containing material with hydrogen content in the range of 5-40 atomic percent.

Referring to FIG. 8, a pixel circuit 100 is shown in accordance with one illustrative embodiment. Circuit 100 includes a junction field effect transistor (JFET) (n channel) 102 having a gate enabled/disabled by a $V_{select}$ signal to gate, a $V_{data}$ signal to a base of a bipolar transistor (p-n-p) 104. A storage capacitor $C_s$ is connected across a supply node ($V_{dd}$) and to the base of the bipolar transistor 104. A collector of the bipolar transistor 104 is connected to an anode of a light emitting diode (LED) 106, e.g., an organic LED (OLED), and a cathode of the light emitting diode is connected to ground (gnd). Although in other embodiments, any of the emitter, base or collector electrode of the lateral bipolar transistor 104 may be electrically connected to an anode or cathode of the OLED 106.

The JFET 102 and lateral bipolar junction transistor 104 are connected where the drain or source of the JFET 102 is connected to the base of the bipolar junction transistor 104, and the collector of the bipolar junction transistor 104 is connected to the anode of the OLED 106. At least one of the source, drain or gate contacts of the JFET 102, or the emitter, base or collector contacts of the lateral bipolar transistors 104 includes a silicon containing material with hydrogen content in the range of 5-40 atomic percent (e.g., a-Si:H).

In accordance with the present embodiments, direct programming of pixels is possible with bottom-emission OLEDs. This is not often possible with similar conventional pixel circuits. Direct programming of OLEDs is preferred over non-direct programming due to simplicity and elimination of the dependence of the OLED program current from the OLED I-V characteristics which may drift over time due to OLED instability issues. For example, the voltage or other characteristics of the OLED, such as $V_{OLED}$, do not contribute to the I-V characteristics of the bipolar junction transistor (e.g., $V_{OLED}$ term is not in the $I_{OLED}$ computation). The best OLEDs available (in terms of efficiency and/or stability) are bottom-emission OLEDs, therefore embodiments permitting the usage of bottom-emission OLEDs are preferred.

OLED devices are classified as bottom emission devices if light emitted passes through a transparent or semi-transparent bottom electrode and substrate on which the organic materials are formed. In a typical bottom-emission OLED, this electrode is the OLED anode. Examples of materials that are used to form the OLED anode include but are not limited to indium-tin-oxide or aluminum-doped zinc-oxide. Top emission devices are classified based on whether or not the light emitted from the OLED device exits through a lid that is added following fabrication of the device. In a typical top-emission OLED light passes through an electrode (cathode) which is formed on the organic materials after the formation of the organic materials on the substrate (anode). A typical top-emission OLED therefore uses a transparent or semi-transparent cathode. Throughout this disclosure, by way of definition, bottom-emission refers to emission through the OLED anode, while top emission refers to emission through the OLED cathode.

In accordance with pixel circuit 100 the current through the LED 106 is $I_{OLED} \approx \beta(V_{dd}-V_{data}-V_{EB})/R_{ON}$ where $R_{ON}$ is the ON resistance of the JFET 102, where $V_{EB}$ is the emitter-base voltage, and $\beta$ is the DC current gain given by the ratio of collector current/base current ($I_C/I_B$). One advantage of the circuit 100 is permitting the use of crystalline channel devices as enabled by the hybrid system presented, e.g., in FIG. 7, as opposed to conventional TFTs using a-Si:H technology where only n-type devices are available for use. Compatibility with bottom-emission OLEDs is an additional advantage. The JFET switch 102 permits a well-defined $R_{ON}$ to produce a linear gray-scale level relationship. Using a bipolar switch in place of the JFET switch 102 would result in an exponential relationship (which is not desirable because several well-defined gray-scale levels would be needed, e.g., 256 levels for an 8-bit display, and 65,536 levels for a 16-bit display).

Conventional circuits with a-Si:H TFTs (only n-channel available) need top-emission OLEDs for direct programming. In addition, $I_{OLED} \approx K(V_{data}-V_T)^2$ where $V_T$ is the threshold voltage of the driver TFT for a top-emission OLED, where K is a transconduction parameter. Conventional a-Si:H TFTs may be employed for non-direct programming with bottom-emission OLEDs. In this case, $I_{OLED} \approx K(V_{data}-V_{OLED}-V_T)^2$.

Conventional a-Si:H has a mobility that is too low for high resolution OLED displays. Low temperature poly Si (LTPS) suffers from device-to-device $V_T$ variation and compensation circuitry limits resolution. In addition, the mobility of LTPS is lower than crystalline Si, thus limiting the display resolution accordingly.

FIGS. 9-11 show other embodiments of a pixel circuit in accordance with the present principles.

Referring to FIG. 9, a pixel circuit 110 includes the n-channel JFET 102 and the p-n-p bipolar transistor 104 arranged in a non-direct programming configuration with a top-emission OLED 106. Here, the storage capacitor $C_s$ is connected between the base of the transistor 104 and ground (gnd). The current through the OLED 106 is $I_{OLED} \approx \beta(V_{dd} - V_{data} - V_{EB} - V_{OLED})/R_{ON}$.

Referring to FIG. 10, a pixel circuit 112 includes a p-channel JFET 122 and an n-p-n bipolar transistor 124 arranged in a non-direct programming configuration with a bottom-emission OLED 106. The storage capacitor $C_s$ is connected between the base and the collector of the transistor 124. The current through the OLED 106 is $I_{OLED} \approx \beta \cdot (V_{data} - V_{BE} - V_{OLED})/R_{ON}$.

The JFET 122 and lateral bipolar junction transistor 124 are connected where the drain or source of the JFET 122 is connected to the base of the bipolar junction transistor 104, and the emitter of the bipolar junction transistor 104 is connected to the anode of the OLED 106. At least one of the source, drain or gate contacts of the JFET 122, or the emitter, base or collector contacts of the lateral bipolar transistors 104 includes a silicon containing material with hydrogen content in the range of 5-40 atomic percent (e.g., a-Si:H).

Referring to FIG. 11, a pixel circuit 114 includes the p-channel JFET 122 and the n-p-n bipolar transistor 124 arranged in a direct programming configuration with a top-emission OLED 106. The storage capacitor C, is connected between the base of the transistor 124 and ground (gnd). The current through the OLED 106 is $I_{OLED} \approx \beta(V_{data} - V_{BE})/R_{ON}$. Note that in all embodiments while $C_S$ is depicted in a given configuration, $C_S$ may be connected either to $V_{dd}$ or to gnd.

Figure 12:
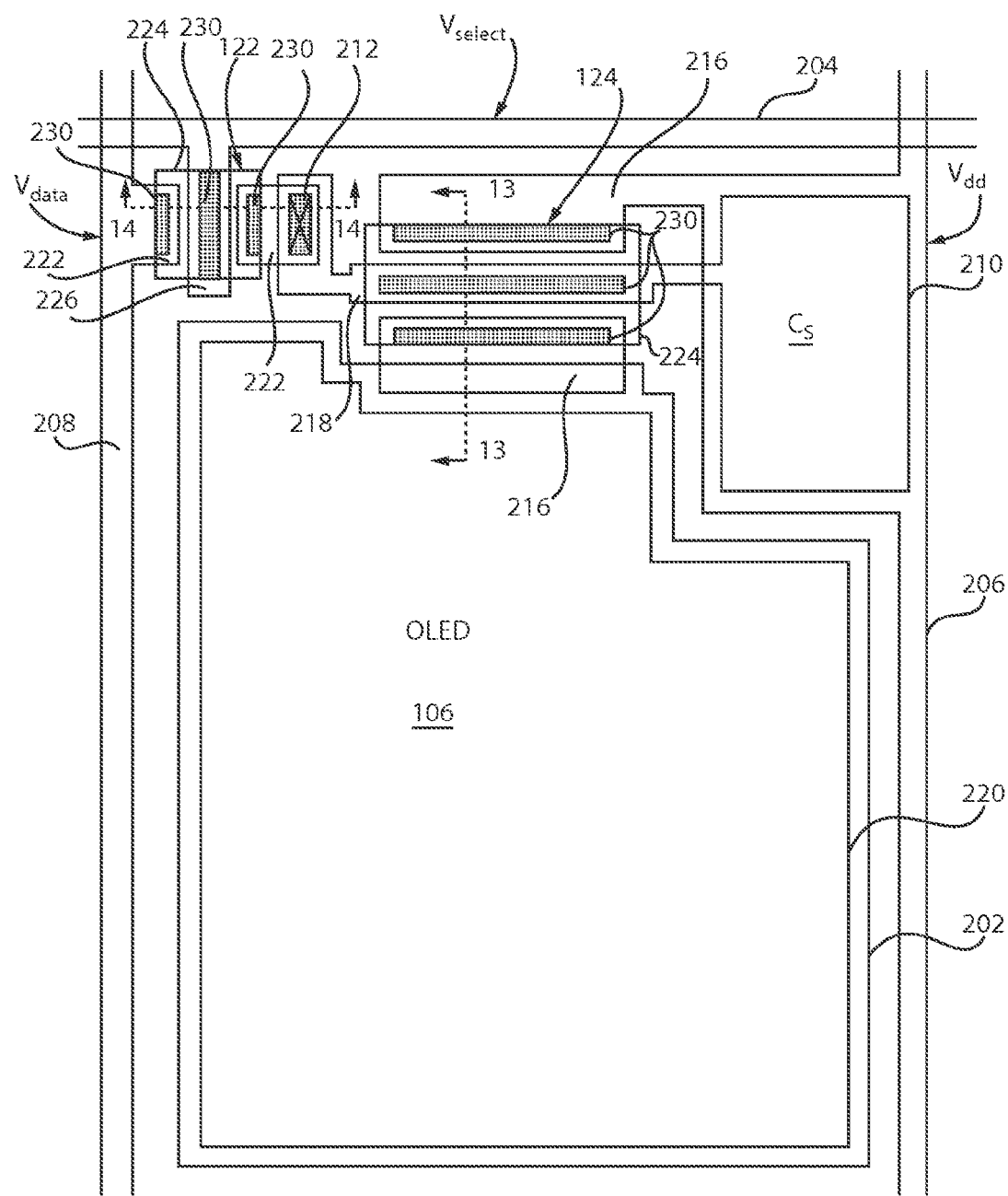
FIG. 12 is a layout view of a pixel circuit having a JFET and a bipolar transistor with crystalline substrate materials in accordance with the present principles.

Referring to FIG. 12, an illustrative pixel circuit layout 200 is shown in accordance with one embodiment. The layout 200 is that of circuit 112 of FIG. 10 and includes JFET 122, bipolar transistor 124, OLED 106 and capacitor $C_s$. The layout 200 is preferably formed on a back-side of the device 8 (FIG. 7), as described above. The OLED 106 forms a pixel or subpixel that is enabled by $V_{data}$ on metal line 208 in accordance with a $V_{select}$ signal on metal line 204. A supply line 206 ($V_{dd}$), metal line 208, one capacitor plate, JFET contacts 222 and contacts 216 may be formed on a first metal layer (e.g., M1). Metal lines 204, a second capacitor plate 210, a base electrode 218 and a JFET gate 226 may be formed on a second metal layer (e.g., M2). Vias 212 can be provided to make connections between the first and second metal layers.

The OLED 106 includes a transparent electrode 202, which forms the OLED anode. A portion 220 of the transparent electrode 202 surface is exposed by opening a via in the dielectric layer(s) covering the transparent electrode 202. The dielectric layer(s) smooth out the edges of transparent electrode 202 and avoid shorts between the anode and cathode. The organic materials and the OLED cathode are then deposited onto the exposed surface 220 of the transparent electrode 202 to form OLED 106.

In accordance with the present principles, the JFET 122 and bipolar transistor 124 are formed on crystalline (or polycrystalline) substrate materials 224. In one particularly useful embodiment, the JFET 122 and bipolar transistor 124 are formed on monocrystalline silicon. Doped diffusion regions 230 are formed in the crystalline substrate materials. 224.

Figure 13:
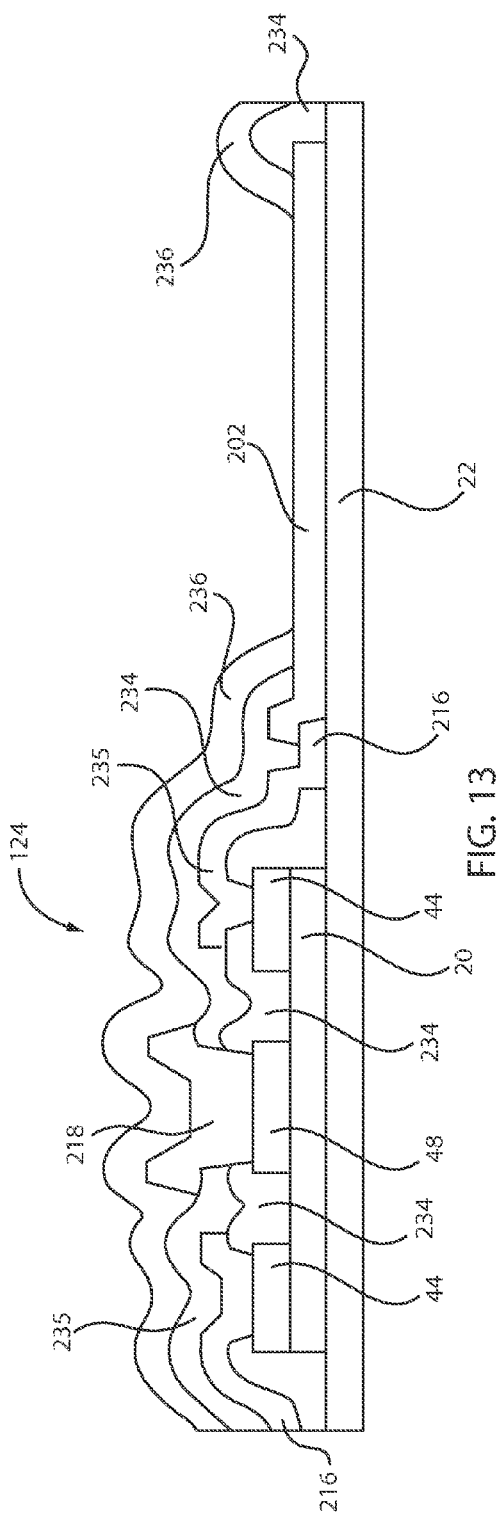
FIG. 13 is a cross-sectional view taken at section line 13-13 of FIG. 12.

Referring to FIG. 13, a cross-sectional view is shown taken at section line 13-13 in FIG. 12, prior to OLED deposition, to show the bipolar transistor 124 in greater detail. The transistor 124 includes an insulating substrate, which may or may not include the dielectric layer 22 of the hybrid system of FIG. 7. A crystalline (or polycrystalline) layer 20 is disposed on the insulating substrate 22 as well as doped regions 44 and 48 (described earlier). Contacts/electrodes 216 (e.g., M1) are formed in contact with the regions 44 and over a patterned first passivation layer 234 (e.g., a silicon oxide). Metal line 218 is formed in contact with the region 48 and over a patterned second passivation layer 235 (e.g., a silicon oxide). A third passivation layer or edge planarization layer 236 is formed. The transparent electrode 202 may include indium tin oxide or similar materials.

Figure 14:
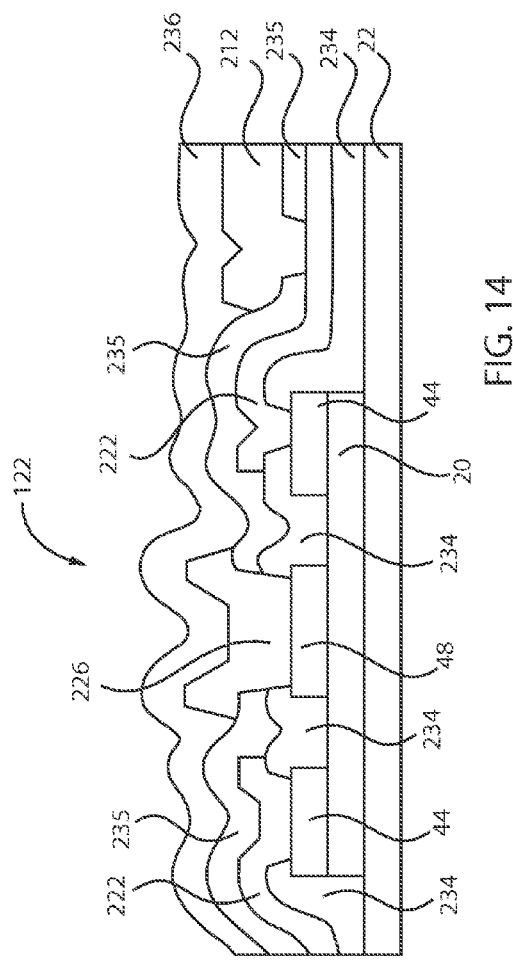
FIG. 14 is a cross-sectional view taken at section line 14-14 of FIG. 12.

Referring to FIG. 14, a cross-sectional view is shown taken at section line 14-14 in FIG. 12, prior to OLED deposition, to show the JFET transistor 122 in greater detail. The transistor 122 includes an insulating substrate, which may or may not include the dielectric layer 22 of the hybrid system of FIG. 7. A crystalline (or polycrystalline) layer 20 is disposed on the insulating substrate 22 as well as doped regions 44 and 48 (described earlier). Contacts/electrodes 222 (e.g., M1) are formed in contact with the regions 44 and over the patterned first passivation layer 234 (e.g., a silicon oxide). Metal line 226 is formed in contact with the region 48 and over the patterned second passivation layer 235 (e.g., a silicon oxide). The third passivation layer or edge planarization layer 236 is formed. The transparent electrode 202 may include indium tin oxide or similar materials.

In preferred fabrication processes, the contact regions 44 on the JFET 122 (102) and bipolar transistor 124 (104) are formed simultaneously (e.g., using the same mask step), and the contact regions 48 on the JFET 122 (102) and bipolar transistor 124 (104) are formed simultaneously (e.g., using the same mask step). The bipolar transistors 104, 124 may include a heterojunction bipolar transistor (HBT) or other bipolar junction transistor (BJT). The pixel circuits described herein may be employed with any bipolar and JFET devices of any device structure and/or formed by any method.

The contacts regions 44, 48 are preferably formed by PECVD deposition at less than 450 degrees C., and more preferably at 150-250 degrees C. The contact regions 44, 48 preferably include wider bandgap materials such as a-Si:H, which is beneficial for increasing the current gain. The transistors 102, 104, 122, and 124 with crystalline substrates perform much better than devices having conventional substrate (body) materials, such as, a-Si:H, organic materials, etc.

Figure 15:
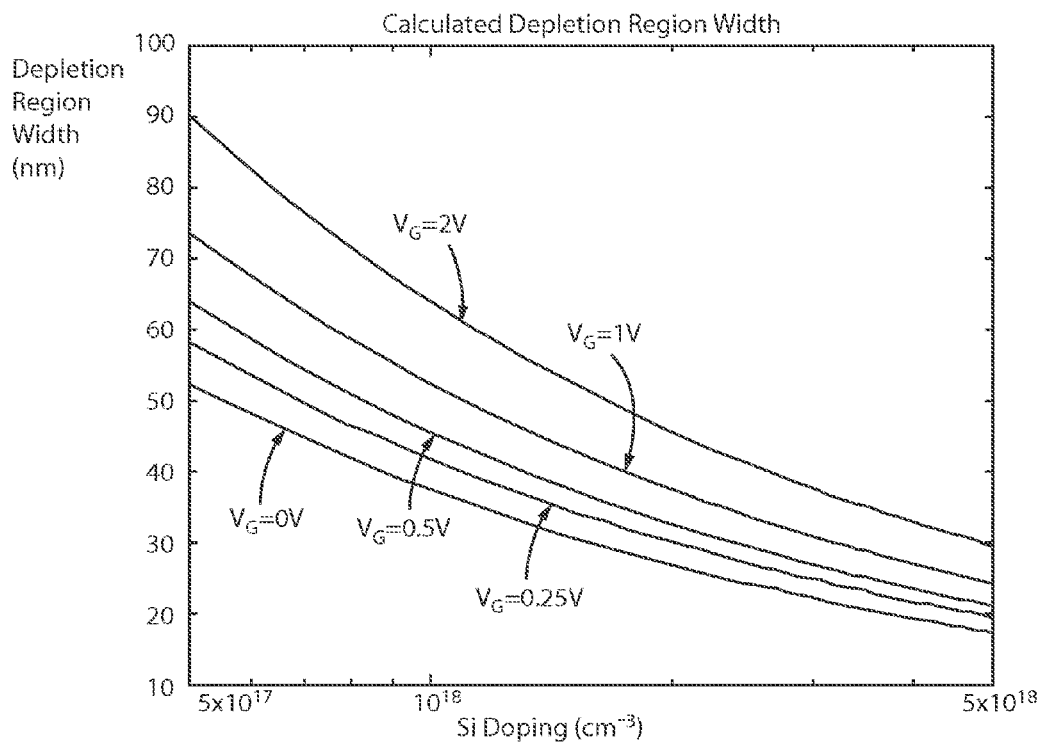
FIG. 15 is a graph showing depletion region width (nm) versus Si doping ($cm^{-3}$) for a plurality of gate voltages for the JFET of the pixel circuit in accordance with the present principles.

Referring to FIG. 15, a graph shows results of an example calculation of depletion region width for a $1^{st}$ order JFET $R_{ON}$ computation. The graph plots a depletion region width (nm) versus Si doping (cm$^{-3}$) for gate voltages ($V_G$) of 0, 0.25, 0.5, 1 and 2 Volts. In accordance with the computation, a p-type Si substrate (with doping: $N_A$) was employed. A gate included n+ doping of $N_D = 5 \times 10^{19}$ cm$^{-3}$. Vbi is built-in potential; $W_D$ is depletion region width, $V_{bi} = kT/q \times \ln(N_A \times N_D/n_i^2)$ (with bandgap narrowing being neglected) where q is the magnitude of the electrical charge of an electron, k is Boltzmann's constant, T is the absolute temperature (300 K) and $n_i$ is the intrinsic carrier concentration in Si ($1.1 \times 10^{10}$ cm$^{-3}$). $W_D = [2 \in_{Si} (V_{bi} + V_G)(1/N_A + 1/N_D)/q]^{1/2}$ where $\in_{Si}$ is the permeability of Si. Assume $t_{Si} = W_D$ (at pinch-off $V_G$), $W_0 = W_D$ (at $V_G = 0$); assume $\mu_p = 100$ cm$^2$/Vs at $N_A = 5 \times 10^{17}$ cm$^{-3}$; assume $\mu_p = 200$ cm$^2$/Vs at $N_A = 5 \times 10^{18}$ cm$^{-3}$ and assume $\mu_p = 1970 - 43.4 \times \ln(N_A)$, $5 \times 10^{17}$ cm$^{-3} < N_A < 5 \times 10^{18}$ cm$^{-3}$. $R_{ON} = 1/[qN_A \mu_p (t_{Si} - W_0)(W/L)]$ where $t_{Si}$ is the Si thickness, $R_{ON}$ is the channel ON resistance, $V_G$ is the gate voltage and $V_S$ is the source voltage. The maximum calculated depletion region width (Max $t_{Si}$) at min $V_G$ for pinch-off, i.e., full depletion is $t_{Si} = W_D$.

Figure 16:
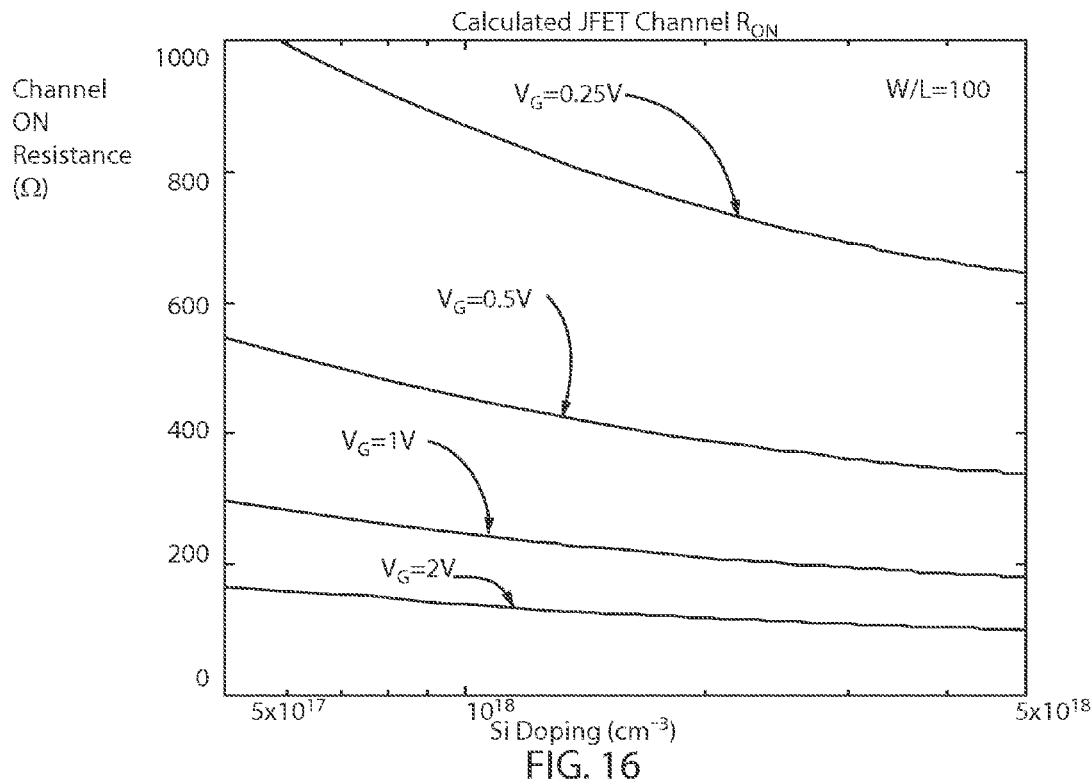
FIG. 16 is a graph showing channel "on" resistance versus Si doping ($cm^{-3}$) for a plurality of gate voltages for the JFET of the pixel circuit in accordance with the present principles.

Referring to FIG. 16, another graph shows calculation results for a JFET channel $R_{ON}$ computation. The graph plots channel $R_{ON}$ (ohms) versus Si doping (cm$^{-3}$) for gate voltages ($V_G$) of 0, 0.25, 0.5, 1 and 2 Volts. The JFET includes a width to length ratio (W/L) of 100. The source/drain series resistance of the JFET adds to the total ON resistance of the JFET and is not included in the plot.

Figure 17:
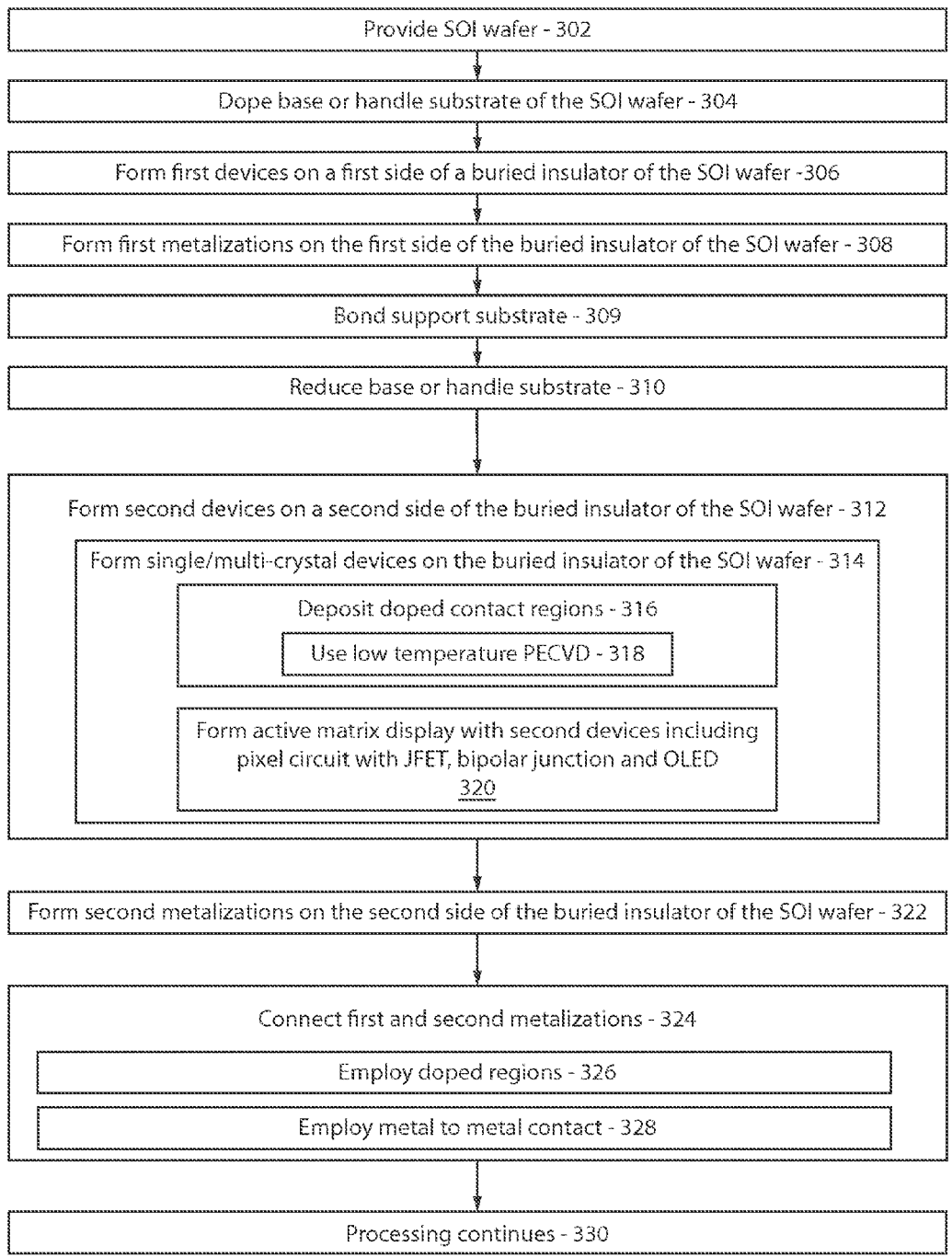
FIG. 17 is a flow diagram showing a method for forming a hybrid system or device in accordance with illustrative embodiments.

Referring to FIG. 17, a method for forming a hybrid integrated circuit device is illustratively shown in accordance with exemplary embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a SOI wafer or substrate is provided for processing. In block 304, a base substrate of the SOI substrate is implanted with dopants through the dielectric layer (BOX). This may occur before or after patterning a semiconductor layer of the SOI wafer. These dopants may include highly doped regions employed for interconnections across or through the dielectric layer (BOX) of the SOI substrate. Other doped regions or components may also be formed by implanting through the dielectric layer/buried insulator (e.g., BOX).

In block 306, first devices in the semiconductor layer on a first side of the buried insulator layer (e.g., BOX). These devices may include CMOS transistors although other device technologies such as bipolar or BiCMOS (bipolar/CMOS) may be employed as well. In block 308, first metallizations (and associated passivation layers, etc.) are formed on a first side of the dielectric layer/buried insulator for connecting to the first devices. In block 309, a support substrate may be bonded over the first metallizations.

In block 310, a thickness of the base substrate is reduced. This may include a mechanical process, a chemical process or combinations thereof. For example, spalling etching and polishing or combinations of these and other processes may be employed. In block 312, second devices are formed in the base substrate. This may include using doped regions formed by implanting through the dielectric layer/buried insulator in block 304. In block 314, transistors are preferably formed in a single crystal or multi-crystal silicon (or other material) of the base substrate (on the buried insulator). In block 316, doped contact regions may be deposited from an amorphous, polycrystalline, crystalline, etc. material (e.g., a-Si), which is patterned on the thinned base substrate. In block 318, the deposition process may form the doped regions using a plasma enhanced chemical vapor deposition process at a temperature below 450 degrees C., or more preferably between 150-250 degrees C.

In block 320, the second devices may provide a backplane (array of transistors) for an active matrix display. The active matrix display may include a pixel circuit including a junction field effect transistor (JFET) enabled by a select signal; a bipolar junction coupled to the JFET to receive data through the JFET, when enabled, at a base of the bipolar junction, the JFET and the bipolar junction including a crystalline channel material; and an organic light emitting diode (OLED) being connected on one side between one of an emitter and a collector of the bipolar junction and, on the other side, between one of supply voltage and ground.

In block 322, second metallizations (passivation layers, etc.) are formed on a second side of the dielectric layer/buried insulator opposite the first side to connect to the second devices. In block 324, the first metallizations are connected to the second metallizations through the dielectric layer. In block 326, the highly doped regions in the base substrate layer may be employed for connecting the first metallizations to the second metallizations through the highly doped regions. In block 328, the first metallizations may be connected to the second metallizations through the dielectric layer by connecting the first metallizations to the second metallizations by metal-to-metal contact including a through via connection. In block 330, processing continues, as needed.

Having described preferred embodiments active matrix using hybrid integrated circuit and bipolar transistor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A pixel circuit for an active matrix display, comprising:
a junction field effect transistor (JFET);
a bipolar junction coupled to the JFET to receive data through the JFET, when enabled, at a base of the bipolar junction, the JFET and the bipolar junction including a crystalline channel material; and
an organic light emitting diode (OLED) being connected on one side between one of an emitter and a collector of the bipolar junction and, on the other side, between one of supply voltage and ground,
wherein the circuit includes a non-direct programming circuit and the OLED includes a bottom-emission device.

2. The circuit as recited in claim 1, wherein the JFET includes a p-type channel material and the bipolar junction includes a n-p-n junction such that current through the OLED includes: $I_{OLED} \approx \beta(V_{data} - V_{BE} - V_{OLED})/R_{ON}$ where $\beta$ is a ratio of collector current to base current, $V_{data}$ is a data voltage, $V_{BE}$ is a base-emitter voltage, $V_{OLED}$ is a voltage across the OLED and $R_{ON}$ is an on resistance of the JFET.

3. The circuit as recited in claim 1, further comprising a storage capacitor coupled between a base and a collector of the bipolar junction.

4. The circuit as recited in claim 1, being formed on a hybrid integrated circuit device, comprising:
a semiconductor-on-insulator substrate having a base substrate, a semiconductor layer and a dielectric layer disposed therebetween, the base substrate being reduced in thickness;
first devices formed in the semiconductor layer, the first devices being connected to first metallizations on a first side of the dielectric layer;
second devices including the pixel circuit formed in the base substrate, the second devices being connected to second metallizations formed on a second side of the dielectric layer opposite the first side; and at least one through via connection configured to connect the first metallizations to the second metallizations through the dielectric layer.

5. The circuit as recited in claim 4, wherein the first devices include complementary metal oxide semiconductor devices.

6. The circuit as recited in claim 4, wherein the base substrate includes a single crystal or multi-crystal material, and the second devices include transistors employing the base substrate as a transistor body.

7. The circuit as recited in claim 4, wherein at least one of the first devices and the second devices are included in an active matrix display.

8. The circuit as recited in claim 4, wherein the base substrate layer includes doped regions formed therein and the doped regions connect to the at least one through via connection to connect the first metallizations to the second metallizations.

9. The circuit as recited in claim 4, wherein the first metallizations are connected to the second metallizations by metal-to-metal contact including the at least one through via connection.

10. The circuit as recited in claim 4, wherein the second devices include bipolar transistors formed in a single crystal or multi-crystal base material and having doped regions formed from amorphous silicon patterned on the base material.

11. The circuit as recited in claim 10, wherein the amorphous silicon includes hydrogenated silicon patterned on the base material, wherein the hydrogenated Si includes 5-40 atomic percent hydrogen.

12. The circuit as recited in claim 1, wherein a drain or source of the JFET is connected to the base of the bipolar junction, and the emitter of the bipolar junction is connected to the anode of the OLED.

13. A pixel circuit for an active matrix display, comprising:
   first devices formed in a semiconductor layer of a semiconductor-on-insulator substrate, the first devices being connected to first metallizations on a first side of a dielectric layer of the semiconductor-on-insulator substrate;
   second devices including the pixel circuit formed in a base substrate of the semiconductor-on-insulator substrate, the second devices being connected to second metallizations formed on a second side of the dielectric layer opposite the first side; and
   at least one through via connection configured to connect the first metallizations to the second metallizations through the dielectric layer;
   the first and second devices including different device types, the device types including at least one of a junction field effect transistor (JFET), complementary metal oxide field effect transistors (CMOS FETs), a thin film transistor (TFT) or a bipolar junction, the first and second devices being coupled by the at least one through via connection.

14. A pixel circuit for an active matrix display, comprising:
   a junction field effect transistor (JFET);
   a bipolar junction coupled to the JFET to receive data through the JFET, when enabled, at a base of the bipolar junction, the JFET and the bipolar junction including a crystalline channel material; and
   an organic light emitting diode (OLED) being connected on one side between one of an emitter and a collector of the bipolar junction and, on the other side, between one of supply voltage and ground,
   wherein the circuit includes a direct programming circuit and the OLED includes a top-emission device.

15. The circuit as recited in claim 14, wherein the JFET includes a p-type channel material and the bipolar junction includes n-p-n junction such that current through the OLED includes: $I_{OLED} \approx \beta(V_{data}-V_{BE})/R_{ON}$ where $\beta$ is a ratio of collector current to base current, $V_{data}$ is a data voltage, $V_{BE}$ is a base-emitter voltage, and $R_{ON}$ is an on resistance of the JFET.

16. The circuit as recited in claim 14, further comprising a storage capacitor coupled between a base of the bipolar junction and a ground.

17. The circuit as recited in claim 14, wherein a drain or source of the p-channel JFET is connected to the base of the bipolar junction, and the collector of the bipolar junction is connected to the cathode of the OLED.

* * * * *